United States Patent
Ueda et al.

(10) Patent No.: US 6,894,373 B2
(45) Date of Patent: May 17, 2005

(54) SURFACE-MOUNTING TYPE OF ELECTRONIC CIRCUIT UNIT SUITABLE FOR MINIATURIZATION AND A METHOD FOR FABRICATING THE UNIT

(75) Inventors: Kazuhiko Ueda, Fukushima-ken (JP); Seiichi Yokoyama, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/440,922

(22) Filed: May 19, 2003

(65) Prior Publication Data

US 2003/0218233 A1 Nov. 27, 2003

(30) Foreign Application Priority Data

May 23, 2002 (JP) .......................................... 2002-149337

(51) Int. Cl.$^7$ .......................... H01L 23/02; H01L 23/15; H01L 23/053; H01L 23/051; H01L 23/043
(52) U.S. Cl. .................... 257/668; 257/666; 257/678; 257/690; 257/703; 257/705; 257/787
(58) Field of Search ................................ 257/666, 668, 257/703, 705, 787

(56) References Cited

U.S. PATENT DOCUMENTS

| | | | | |
|---|---|---|---|---|
| 5,095,359 A | * | 3/1992 | Tanaka et al. .............. 257/703 |
| 5,241,456 A | * | 8/1993 | Marcinkiewicz et al. ... 361/792 |
| 5,371,405 A | * | 12/1994 | Kagawa ...................... 257/664 |
| 5,401,910 A | * | 3/1995 | Mandai et al. .............. 174/250 |
| 5,790,385 A | * | 8/1998 | Tanimura .................... 361/766 |
| 6,111,306 A | * | 8/2000 | Kawahara et al. .......... 257/666 |
| 6,498,043 B1 | * | 12/2002 | Schulman et al. ............. 438/1 |
| 6,518,658 B2 | * | 2/2003 | Yoshisato et al. ........... 257/701 |
| 2003/0094679 A1 | * | 5/2003 | Asano et al. ............... 257/678 |
| 2003/0193086 A1 | * | 10/2003 | Adachi et al. .............. 257/710 |

FOREIGN PATENT DOCUMENTS

JP      2001-339033      12/2001

* cited by examiner

*Primary Examiner*—Tom Thomas
*Assistant Examiner*—Jesse A. Fenty
(74) *Attorney, Agent, or Firm*—Brinks Hofer Gilson & Lione (57) ABSTRACT

Thin film circuit elements including capacitors, resistors, and inductance elements are formed on a large substrate, and semiconductor chips are wire bonded to the substrate. The elements and chips are sealed by potting a sealing resin. The large substrate is divided into multiple stripe substrates by dicing and a thin-film conductive layer is sputtered on cut surfaces of the stripe substrates, thereby electrically connecting edges of lower conductive patterns to edges of upper conductive patterns exposed from side surfaces of the sealing resin through the thin-film conductive layer. A Ni foundation layer and Au layer are successively plated on a surface of the thin-film conductive layer to form edge electrodes on side surfaces of the stripe substrates and the stripe substrates are divided finely into individual alumina substrates.

39 Claims, 9 Drawing Sheets

SURFACE-MOUNTING TYPE OF ELECTRONIC CIRCUIT UNIT SUITABLE FOR MINIATURIZATION AND A METHOD FOR FABRICATING THE UNIT

BACKGROUND OF THE INVENTION

1. Field of the Invention

The present invention relates to a surface-mounting type of electronic circuit unit and a method for fabricating the unit.

2. Description of the Related Art

Typically, components in surface-mounting type electronic circuit units are chip components such as resistors and capacitors or semiconductor components such as transistors that are soldered on solder lands in a conductive pattern provided on a rectangular, platelike substrate. These circuit components are covered by a shield cover. Edge electrodes are provided on side surfaces of the substrate, and respective conductive patterns provided on both top and back surfaces of the substrate are conducted to each other by the edge electrodes. The edge electrodes are formed by printing a silver (Ag) paste such that they extend over the both upper and lower conductive patterns derived on ends of the substrate, curing the paste, and plating the paste with nickel (Ni) and gold (Au) layers. Thus, when the electronic circuit unit is surface-mounted on a base substrate, the edge electrodes can be connected on lands of the base substrate using a conductive adhesive.

Recently, the circuit components have been miniaturized. For example, an ultracompact chip resister and chip capacitor having outside dimensions of about 0.6*0.3 mm have been put into practical use. In the conventional electronic circuit unit in which such ultracompact circuit components are used, and in which the pitch between the circuit components mounted on the substrate is correspondingly narrowed, the electronic circuit unit can be miniaturized only to a certain extent, i.e. miniaturization of the circuit components is limited. Moreover, when a number of circuit components are mounted on the substrate, a soldered portion of each circuit component may not be shortened during mounting. Thus, the narrowing of the pitch among the components is also limited. These limitations have been a major factor impeding further miniaturization of the electronic circuit unit.

In addition, in the conventional electronic circuit unit, although the unit is configured such that the silver paste is printed on the side surfaces of the substrate to provide an electrical connection between the upper and lower conductive patterns, it is difficult to control print dripping of the silver paste. Further, the silver is cracked after curing when the treatment temperature is not appropriately controlled. Due to both of these problems, the process for forming the edge electrodes is extremely complex and difficult, as well as being relatively time consuming and expensive.

The invention, which was made in view of the problems inherent in the conventional mounting technique, provides a surface-mounting type of electronic circuit unit that can simplify the process for forming the edge electrodes and is suitable for miniaturization.

SUMMARY OF THE INVENTION

To achieve the objectives stated herein, as well as other objectives apparent herein, in a first embodiment the electronic circuit unit comprises thin film circuit elements including at least one capacitor, at least one resistor, and at least one inductance element formed on one surface of an alumina substrate; thin film upper and lower conductive patterns formed on the one surface and an opposing surface of the alumina substrate, respectively; at least one semiconductor chip bonded to the upper conductive patterns by wire bonding; a thermosetting resin that seals the circuit elements, upper conductive patterns, and semiconductor chips on the alumina substrate; and at least one edge electrode sputtered on a side surface of the alumina substrate, wherein an edge of the upper conductive patterns is exposed from a side surface of the thermosetting resin, and the edge electrode provides a connection between respective edges of the upper conductive patterns and the lower conductive patterns.

Since the above circuit elements are formed precisely using a thin film technique, and the semiconductor element comprises chips to which wire bonding was performed, the density of mounting the circuit components on the alumina substrate is increased. Moreover, since the circuit components are sealed by thermosetting resin, the surface-mounting type of electronic circuit unit may be further miniaturized. In addition, in the thin film upper and lower conductive patterns formed on the both surfaces of the alumina substrate, the edges of the upper conductive patterns are exposed from the side surfaces of the thermosetting resin, and the edge electrodes sputtered on the side surfaces of the alumina substrate provide a connection between respective edges of the upper conductive patterns and lower conductive patterns, therefore the process for forming the edge electrodes can be simplified.

In the configuration, a nickel plating as a lower layer and a gold plating as an upper layer are preferably provided on the edge electrodes, and, in the electronic circuit unit having such edge electrodes, the edge electrodes can be connected on the lands of the base substrate using the conductive adhesive when the unit is surface-mounted on the base substrate. The nickel layer is thick enough to provide adhesion of the gold layer to the edge electrode and the gold layer is thick enough to reduce contact resistance of the edge electrode.

Ground electrodes may be disposed near corners on a first side of the one surface and on a second side opposing the first side with non-ground electrodes disposed between the ground electrodes, and on the second side a ground electrode disposed adjacent to one of the other two ground electrodes. A pair of projections may narrow a gap portion between at least one of the capacitors and at least one of the non-ground electrodes.

A first capacitor of the thin film elements may have a concave shape with two rectangles projecting from one side of another rectangle and a second capacitor may have a tri-rectangular shape with three rectangles arranged continuously in a dislocated relation along a long side of the tri-rectangular shape.

A pair of resistors may form a voltage divider and be disposed parallel and adjacent to each other with another resistor separated by relatively large distance compared with a distance separating the pair of resistors. Ratios of the resistances of the pair of resistors from desired values in this case are equal.

A conductive path may be connected with an end of one of the inductance elements. In this case, the conductive path increases an inductance of the one of the inductance elements and has a width and characteristic impedance equal to that of the one of the inductance elements.

The semiconductor chip may be fixed on a connection land using conductive adhesive. The connection land may have an area smaller than that of a lower surface of the semiconductor chip which is small enough such that extrusion of the conductive adhesive from dimensions corresponding to semiconductor chip and shorting to the surrounding upper conductive pattern is prevented. Further, an opening may be provided within the connection land in which the conductive adhesive pools.

The substrate may be defined by dividing grooves of a larger substrate which extend lengthwise and crosswise and form the side surfaces of the substrate.

In another embodiment, a method for fabricating the electronic circuit unit of the invention comprises forming the circuit elements including the at least one capacitor, at least one resistor and at least one inductance element and the upper conductive pattern connected to the thin film circuit elements on one surface of a large substrate comprising an alumina material; forming the thin film lower conductive patterns on an opposing surface of the large substrate; wire bonding the semiconductor chips to the upper conductive pattern, then potting the thermosetting resin on the one surface of the large substrate to seal the circuit elements, upper conductive patterns, and semiconductor chips; dividing the large-sized substrate after potting into multiple stripe substrates; sputtering an edge electrode on a side surface along a longitudinal direction of at least one of the stripe substrates, thereby providing a connection between respective edges of the lower conductive patterns and the upper conductive patterns exposed from the side surface of the thermosetting resin; and dividing the stripe substrates finely into individual alumina substrates after sputtering the edge electrodes.

According this method, since the circuit elements are formed precisely using thin film techniques, and the semiconductor elements are chips to which wire bonding was performed, the circuit components are mounted precisely on the alumina substrate. Moreover, since the circuit components are sealed by the thermosetting resin, a surface-mounting type electronic circuit unit that is further miniaturized is obtained. In addition, the large substrate is divided into multiple stripe substrates after potting the thermosetting resin, and the edge electrodes are sputtered on the side surfaces of the stripe substrates. This provides a connection between respective edges of the upper conductive patterns and lower conductive patterns. The stripe substrates are then divided finely into individual alumina substrates. This permits the process for forming the edge electrodes to be simplified, and thus productivity in mass production to be improved.

The method may further comprise dividing the substrate into the multiple stripe substrates by dicing in a cutting direction from a side on which the lower conductive pattern is formed to the thermosetting resin or simultaneously sputtering edge electrodes on side surfaces of a plurality of the stripe substrates along longitudinal directions of the plurality of the stripe substrates.

The method may further comprise plating a lower nickel layer and an upper gold layer on the edge electrode in which the nickel layer is thick enough to provide adhesion of the gold layer to the edge electrode and the gold layer is thick enough to reduce contact resistance of the edge electrode.

The method may further comprise forming ground electrodes near corners on a first side of the one surface and on a second side opposing the first side, forming non-ground electrodes between the ground electrodes, and forming an additional ground electrode adjacent to one of the two ground electrodes on the second side.

The method may further comprise enabling a low voltage discharge by narrowing a gap portion between at least one of the capacitors and at least one of the non-ground electrodes.

The method may further comprise increasing capacitance of capacitors formed as thin film circuit elements and decreasing space used by the capacitors by forming the capacitors with one of a concave shape with two rectangles projecting from one side of another rectangle and a tri-rectangular shape having three rectangles arranged continuously in a dislocated relation along a long side of the tri-rectangular shape. The method may also comprise increasing capacitance of capacitors formed as thin film circuit elements to increase a parasitic oscillation frequency to at least an operating point frequency of the transistor, thereby eliminating parasitic oscillation of the transistor.

The method may further comprise forming a voltage divider using at least a pair of resistors disposed parallel and adjacent to each other whose ratios of resistances from desired values are equal thereby eliminating trimming of the pair of resistors, and forming another resistor separated by relatively large distance compared with a distance separating the pair of resistors.

The method may further comprise increasing an inductance of one of the inductance elements by trimming a conductive path connected with an end of the one of the inductance elements, and forming the conductive path to have a width and characteristic impedance equal to that of the one of the inductance elements.

The method may further comprise fixing the semiconductor chip on a connection land having an area smaller than that of a lower surface of the semiconductor chip using conductive adhesive, and preventing extrusion of the conductive adhesive from dimensions corresponding to semiconductor chip and thus shorting to the surrounding upper conductive pattern by decreasing a ratio of the area of the conduction land to that of the lower surface of the semiconductor chip. In this case, the method may also comprise forming an opening in the connection land and permitting the conductive adhesive to pool in the opening.

The method may also comprise forming dividing grooves that extend lengthwise and crosswise in the substrate to define the individual substrates and dividing the substrate and the stripe substrates into the individual substrates along the grooves.

In the configuration, although laser machining maybe used to divide the large substrate into multiple stripe substrates, it is preferable to divide the large substrate into the multiple stripe substrates by dicing. Further, when the dicing is performed in a cutting direction from a side on which the lower conductive pattern was formed to the thermosetting resin, a shear force acts on the upper conductive patterns and promotes peeling from the substrate. The thermosetting resin prevents peeling of the upper conductive patterns and lower conductive patterns.

DESCRIPTION OF THE PREFERRED EMBODIMENTS

Figure 1:
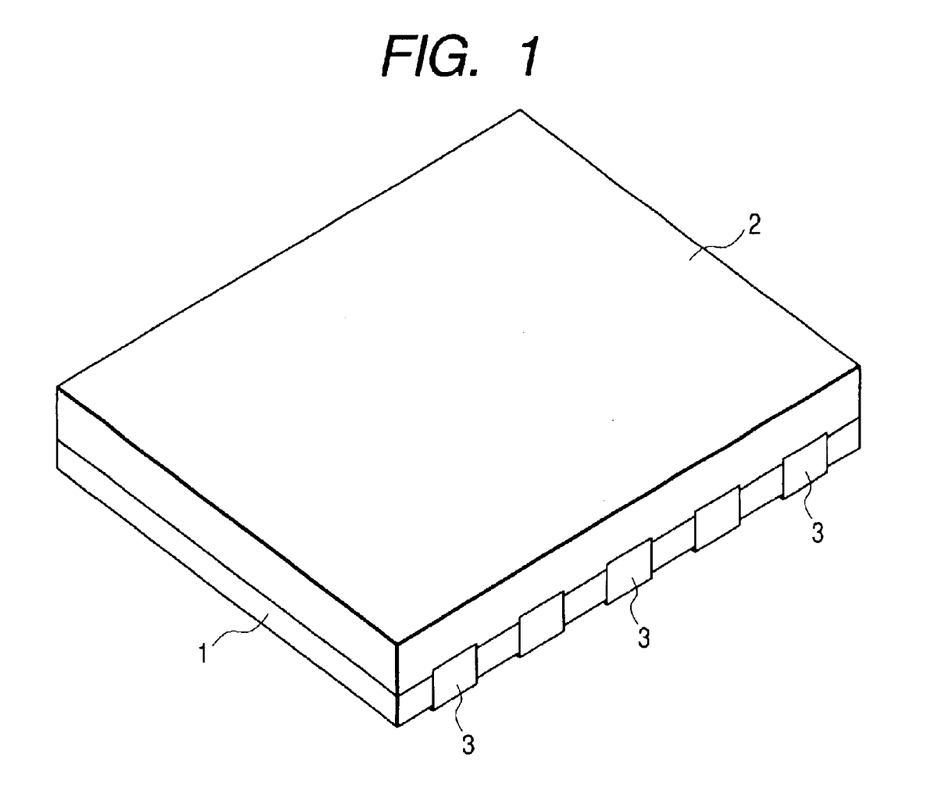
FIG. 1 is a perspective view of an electronic circuit unit according to an embodiment of the invention.
Figure 2:
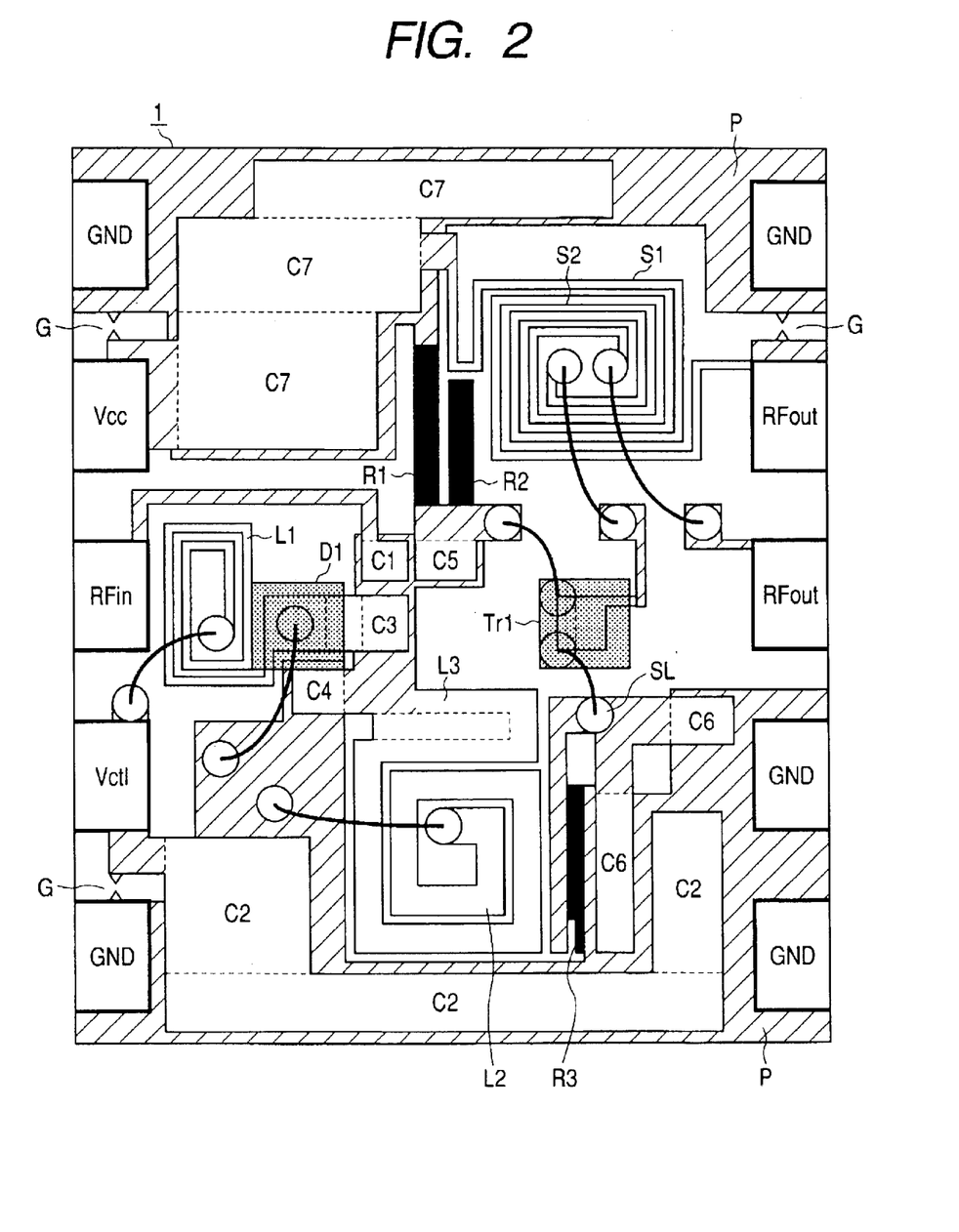
FIG. 2 is a plan view of an alumina substrate showing a layout of a circuit configuration.
Figure 3:
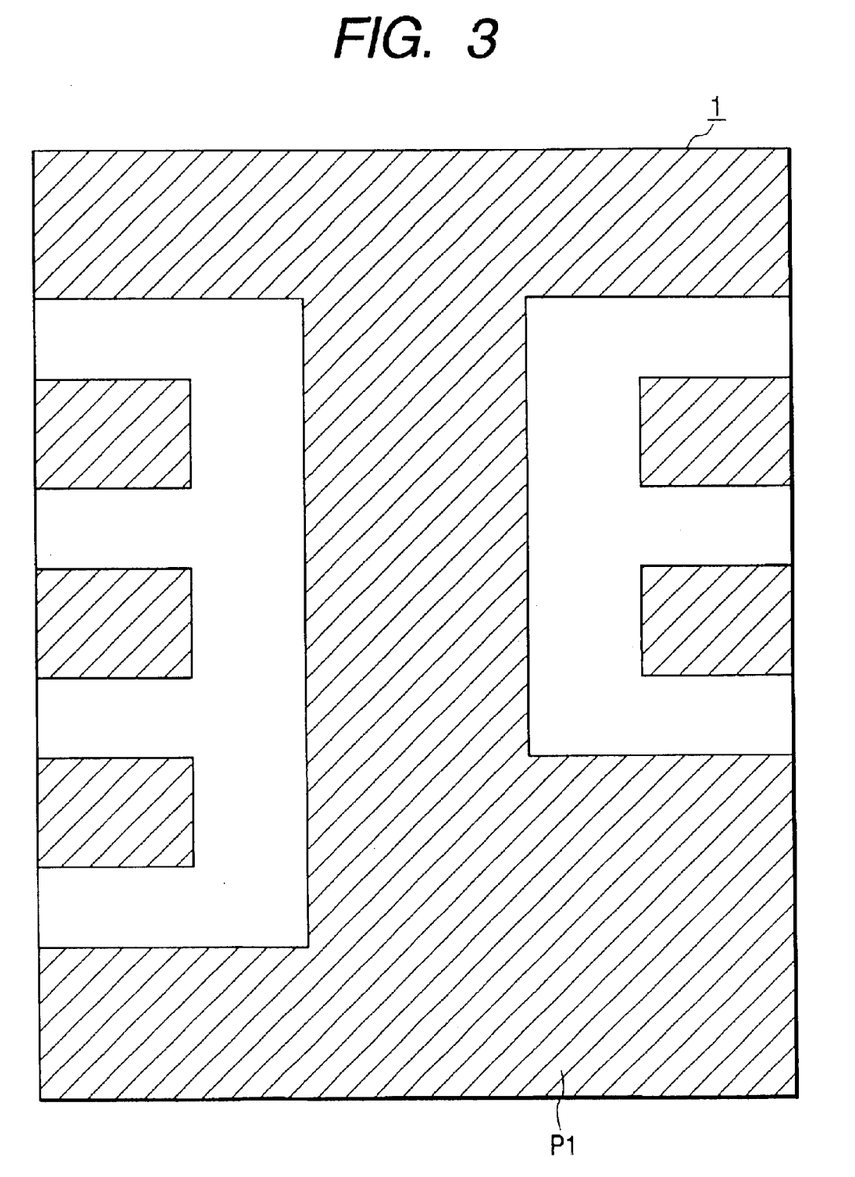
FIG. 3 is a backside back view of the alumina substrate.
Figure 4:
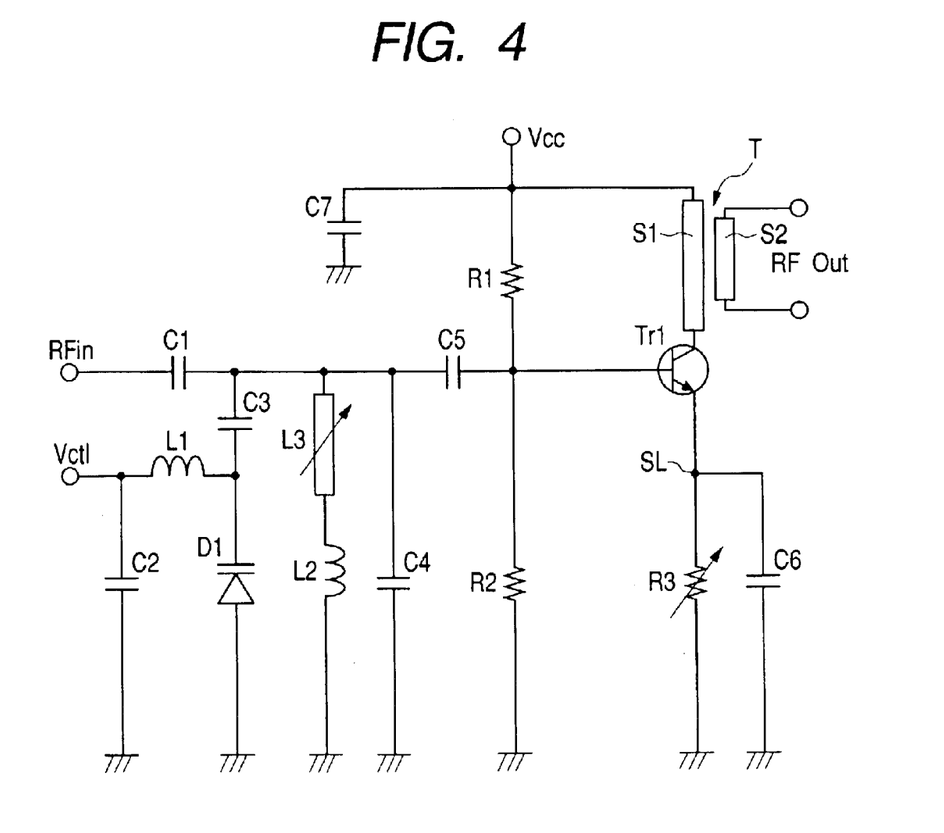
FIG. 4 is an explanation view of the circuit configuration.
Figure 5:
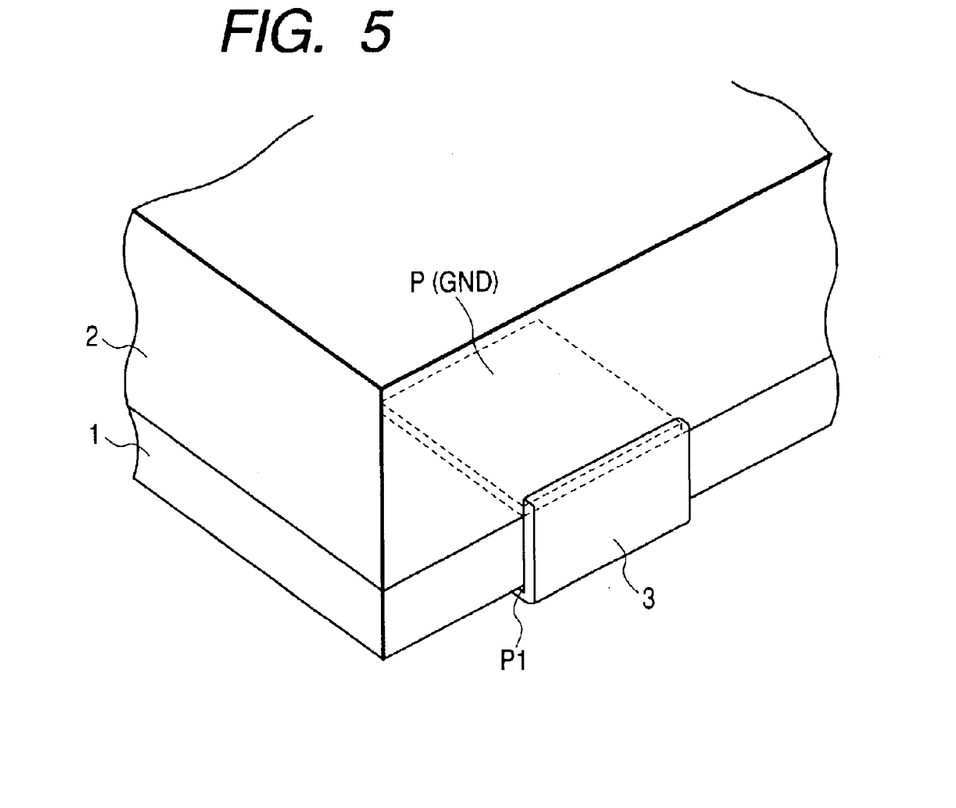
FIG. 5 is a perspective view showing an edge electrode.
Figure 6:
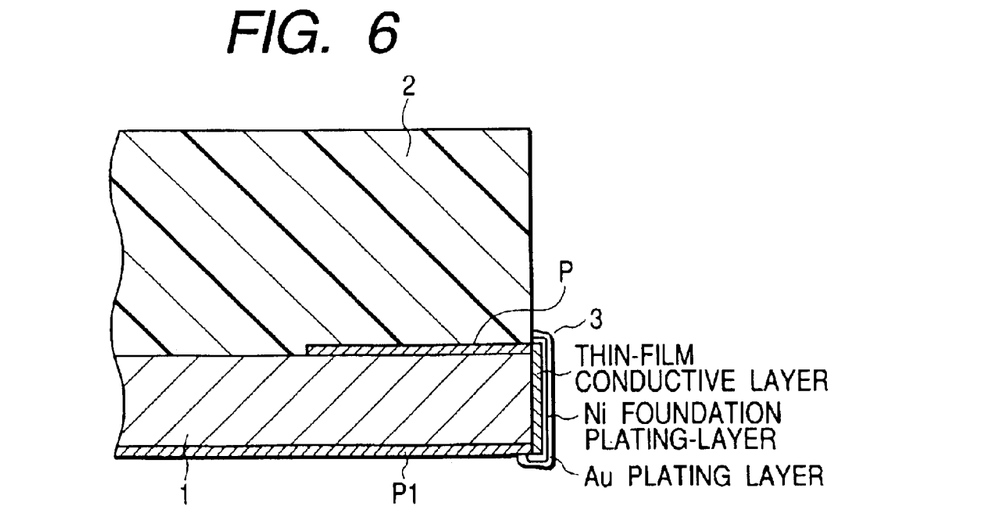
FIG. 6 is a sectional view of the edge electrode.

Hereinafter, preferred embodiments of the invention are described with reference to drawings, where FIG. 1 is a perspective view of an electronic circuit unit, FIG. 2 is a plan view of an alumina substrate showing a layout of a circuit configuration, FIG. 3 is a backside back view of the alumina substrate, FIG. 4 is an explanation view of the circuit configuration, FIG. 5 is a perspective view showing an edge electrode, FIG. 6 is a sectional view of the edge electrode, FIG. 7 is an explanation view showing a relationship between a semiconductor chip and connection land, and FIG. 8 is an explanation view showing a fabrication process of the electronic circuit unit.

The embodiments are examples in which the invention is applied to a frequency-tuning-type booster amplifier, and the frequency-tuning-type booster amplifier is used in combination with a UHF tuner, not shown, to improve reception of a portable TV device (particularly, reception sensitivity and jamming resistance), and to select and amplify a TV signal having a desired frequency and input the amplified signal into the UHF tuner.

FIG. 1 shows one example of the frequency-tuning-type booster amplifier (electronic circuit unit) As shown in the drawing, the frequency-tuning-type booster amplifier comprises an alumina substrate 1 on which elements for forming the circuit, described later, are mounted and a sealing resin 2 potted on the alumina substrate 1. The alumina substrate 1 is formed in a rectangular, platelike shape, which is obtained by cutting a large substrate into divided stripe strips, then further dividing the divided strips finely. The sealing resin 2 comprises an epoxy-based thermosetting resin, and the sealing resin 2 covers the elements that form the circuit on the alumina substrate 1. A metal shield cover can be attached on the sealing resin 2 as required.

As shown in FIG. 2, the elements that form the circuit and conductive patterns connecting the elements are provided on the surface of the alumina substrate 1. As shown in FIG. 3, conductive patterns as back surface electrodes are provided on the back surface of the alumina substrate 1. The frequency-tuning-type booster amplifier according to the embodiment, which has a tuning circuit and amplifying circuit for selection and amplification of TV signals, is in a circuit configuration as shown in FIG. 4, and each of the elements that form the circuit shown in FIG. 2 are marked with symbols corresponding to those in the circuit diagram of FIG. 4. However, FIG. 4 shows merely an example of the circuit configuration, and the invention can be applied to any electronic circuit unit having a circuit configuration other than that shown.

As shown in FIG. 4, the frequency-tuning-type booster amplifier has capacitors C1 to C7, resistors R1 to R3, inductance elements L1 to L3, a diode D1, a transistor Tr1, and conductive paths S1 and S2 as the elements the form the circuits for the tuning circuit and amplifying circuit. The elements that form the circuits and the conductive patterns connecting the elements are provided on the surface of the alumina substrate 1. The conductive patterns, which are formed using thin film techniques including sputtering of Cr and Cu, are referred to as upper conductive patterns in the following description, and indicated by hatching with symbol P in FIG. 2. Techniques other than sputtering may also be used to fabricate the thin film conductive patterns (and the electrodes).

The circuit configuration of the frequency-tuning-type booster amplifier is described briefly. To select and amplify a TV signal having a desired frequency, the circuit is comprised of a tuning circuit that contains the inductance elements L2 and L3, capacitors C3 and C4, and the diode D1, and an amplifying circuit comprising the transistor Tr1 and its peripheral circuit elements (resistors R1 to R3 and capacitor C6) and an unbalance/balance conversion element T. A TV signal having multiple frequencies is supplied to the tuning circuit through the capacitor C1.

Since a tuning frequency (resonance frequency) of the tuning circuit is varied by controlling a voltage (Vctl) applied to a cathode of the diode D1, the tuning frequency is matched with the frequency of the desired TV signal, thereby only the desired TV signal is selected and supplied to a base of the transistor Tr1 in the amplifying circuit through the capacitor C5. A bias voltage is provided by the voltage dividing resistors R1 and R2 for base bias of the base of the transistor Tr1. A collector current (nearly equal to emitter current) of the transistor Tr1 is established based on a resistance of the variable emitter resistor R3. The TV signal amplified by the transistor Tr1 is supplied by the collector, and the unbalance/balance conversion element T is provided for the collector. The unbalance/balance conversion element T is comprised of the inductance elements containing a pair of conductive paths S1 and S2 coupled with each other, and a balanced TV signal is provided from both ends of the conductive path S2 and supplied to the UHF tuner.

As shown in FIG. 2, ground electrodes (GND), input electrodes (Vcc, Vctl, RFin), and output electrodes (RFout) are formed on edges of the alumina substrate 1, which are comprised of part of the upper conductive patterns P. The ground electrodes, input electrodes, and output electrodes are formed only on two opposing long sides of the rectangular alumina substrate 1, and not formed on the other two opposed short-sides. That is, the GND electrodes are formed in the vicinity of both corners of one long side of the alumina substrate 1, and the Vcc electrode, RFin electrode, and Vctl electrode are formed between the GND electrodes. In addition, the GND electrodes are formed at three points along the opposing long side of the alumina substrate 1 (two are formed in the vicinity of the corners and the third GND electrode is formed adjacent to one of the other two GND electrodes), and two RFout electrodes are formed between the GND electrodes. As described later, the two long sides of the alumina substrate 1 correspond to dividing lines that are used when the large substrate is cut into the divided stripe strips, and the two short sides of the alumina substrate 1 correspond to dividing lines when the divided strips are further divided finely.

On the other hand, as shown in FIG. 3, the conductive patterns are formed on the back surface of the alumina substrate 1 using the thin film technique including sputtering of Cr and Cu and the like, and the conductive patterns are referred to as lower conductive patterns in the following description, and marked with symbol P1. Edges of the lower conductive patterns P1 (back surface electrode) are opposed to the ground electrodes (GND), input electrodes (Vcc, Vctl, RFin), and output electrodes (RFout) on the alumina substrate 1, and as shown in FIG. 5 and FIG. 6, the opposed electrodes and conductive patterns are connected with each other through edge electrodes 3. That is, edges of the ground electrodes (GND), input electrodes (Vcc, Vctl, RFin), and output electrodes (RFout) are exposed from side surfaces of the sealing resin 2, and Cr and Cu are sputtered on edges of the alumina substrate 1. This connects the edges of the ground electrodes (GND), input electrodes (Vcc, Vctl, RFin), and output electrodes (RFout) connected with the upper conductive patterns P with the edges of the lower conductive patterns P1 opposed to the electrodes through the edge electrodes 3. The edge electrodes 3 comprise a Ni foundation plating layer and Au plating layer stacked successively on the thin-film conductive layer of Cr and Cu which are sputtered on the edges of the alumina substrate 1. The Ni foundation plating-layer is an intermediate layer that helps adhesion of the Au plating layer and the Au plating layer is an uppermost layer that reduces contact resistance to a conductive adhesive when the edge electrodes 3 are adhered on lands in a base substrate, not shown, using the conductive adhesive.

Among respective elements that form the circuits, the capacitors C1 to C7 comprise an upper electrode layer stacked on a lower electrode layer with a dielectric film such as $SiO_2$ between them, and the layers and film are formed as thin films using sputtering. A Cu layer is provided as a top layer of the upper electrode, which increases Q of the resonance circuit. The lower electrode and upper electrode of the capacitor C1 to C7 are connected to the upper conductive patterns P.

As shown in FIG. 2, close gap portions (air gaps) G are provided on the upper conductive patterns P between the capacitor C7 and Vcc electrode, between the capacitor C7 and RFout electrode, and between the capacitor C2 and Vctl electrode respectively. The close gap portions G are comprised of a pair of opposing projections provided on respective particular opposing upper-conductive-patterns P, and respective ends of both projections narrow the distance between the upper-conductive-patterns P to a predetermined gap. In this case, dimension accuracy of each of the upper conductive patterns P and GND electrodes is improved by using the thin film technique, permitting the gap of the close gap portions G to be narrowed and consequently enabling a low voltage discharge.

Among respective capacitors C1 to C7, while the capacitors C1, and C3 to C5 are formed in a simple rectangle shape, the capacitors C2 and C7 are formed in an irregular shape that contains a combination of two or more rectangles. That is, the capacitor C2 is in a concave shape in which two rectangles project from one side of one rectangle, and the capacitor C7 is in a shape in which three rectangles are arranged continuously in a dislocated relation along a long side. The capacitors C2 and C7 are ground capacitors that require a comparatively large capacitance value, and when the ground capacitors C2 and C7 are made in such irregular shapes, the limited space on the alumina substrate 1 can be effectively used, and a high density capacitor having a desired large capacitance value can be mounted.

Further, among respective capacitors C1 to C7, the capacitor C6 is comprised of two ground capacitors having different sizes, which are connected in parallel through a pair of upper conductive patterns P separated with each other. That is, as shown in FIG. 2, one electrode portion of each of the two ground capacitors C6 forms a capacitance with an upper conductive pattern P connected to the GND electrodes, while the other electrode portion of each of the two ground capacitors is connected to a connection land SL in turn connected to the transistor Tr1. As seen apparently from FIG. 4, the capacitor C6 is provided between an emitter of the transistor Tr1 and the ground, and the connection land SL is a connection land to which the emitter electrode of the transistor Tr1 is bonded by wire bonding, whereby the capacitance value of the capacitor C6 is established by the two ground capacitors connected in parallel through the upper conductive patterns P separated with each other. This permits the total inductance of the upper conductive patterns P from the emitter electrode of the transistor Tr1 to the ground through the capacitor C6 to be reduced, and thus ground effect on the connection land SL caused by the ground capacitor C6 is improved. In addition, since the parasitic oscillation frequency caused by each of the ground capacitors C6 and each of the upper conductive patterns P is increased and this frequency is set to an operating point frequency of the transistor Tr1 or more, the parasitic oscillation can be eliminated.

The resistors R1 to R3, which are formed by sputtering of a resistance film such as $TaSiO_2$ for example, have a dielectric film such as $SiO_2$ provided thereon as required. As shown in FIG. 2, among the three resistors R1 to R3, the thin film resistors R1 and R2 are arranged in parallel adjacent to each other and formed on the alumina substrate 1, and the remaining thin film resistor R3 is separated from the resistors R1 and R2 by a relatively large distance compared with the distance separating the resistors R1 and R2. In this way, as the resistors R1 and R2 are adjacent thin films, even if the resistance values of the resistors R1 and R2 vary from the desired values, the total variation ratio of the resistors R1 and R2 from the desired value of each resistor are more easily set equal. As shown in FIG. 4, the resistors R1 and R2 are voltage dividing resistors for base bias of the transistor Tr1, and a voltage of $R1/(R1+R2)*Vcc$ is applied to the base of the transistor Tr1. Here, since the total variation ratios of the resistors R1 and R2 are equal to each other at all times as described above, it is unnecessary to trim the resistance value for the resistors R1 and R2. On the other hand, the resistor R3 is an emitter resistor for the transistor Tr1. A current flows from the Vcc electrode into the collector and emitter of the transistor Tr1 and passes through the resistor R3 to the ground. Here, among respective resistors R1 to R3, the emitter resistor R3 mostly contributes to amplification of the transistor Tr1, therefore only the resistor R3 is trimmed to adjust its output such that the current value is kept constant.

Figure 9:
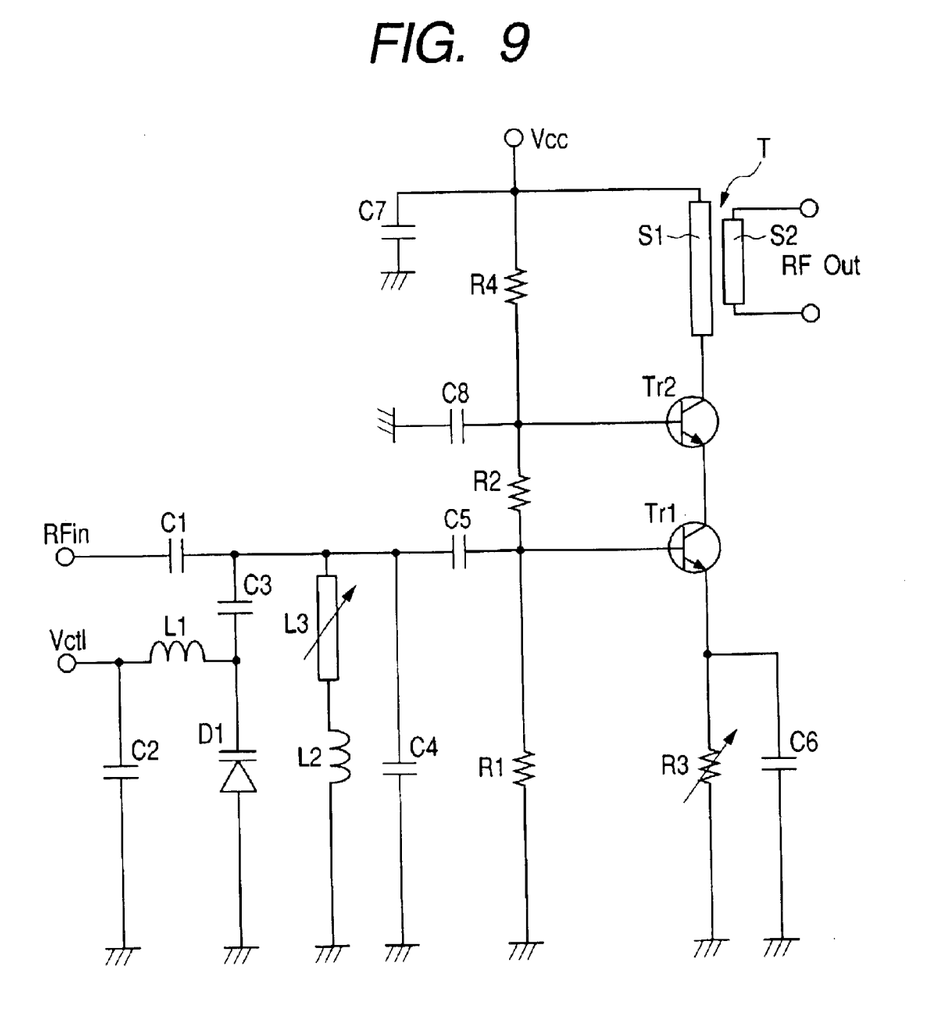
FIG. 9 is an explanation view of another circuit configuration, and, FIG. 10 is a plan view of an alumina substrate showing another layout of the circuit configuration.

As shown in FIG. 9, in case of a circuit configuration in which another transistor Tr2 is connected in series to the transistor Tr1, when thin film resistors R1, R2, and R4, which are voltage dividing resistors providing base bias to both transistors Tr1 and Tr2, are adjacent to one another on the alumina substrate 1, it is again unnecessary to trim the resistance value for the resistors R1, R2, and R4. Therefore, again in this case, current values of the transistors Tr1 and Tr2 can be established by trimming only the resistor R3 as the emitter resistor.

The inductance elements L1 to L3 and conductive paths S1 and S2, which are formed by sputtering Cr and Cu as above, are connected to the upper conductive patterns P. A Cu layer is provided as a top of the inductance elements L1 to L3, and the Cu layer increases Q of the resonance circuit. Each of the inductance elements L1 and L2 is formed in a square, spiral shape, and one end of each element is bonded by wire bonding to the Vctl electrode or upper conductive patterns P for ground respectively. The inductance element L2 coarsely sets resonance frequency. The inductance element L3 is connected with the other end of the inductance element L2 (the end that is not connected to the upper conductive patterns P) and comprises a conductive pattern by which the resonance frequency is further adjusted. As shown by dashed line in FIG. 2, the inductance element L3 is trimmed and reduced, thereby increasing the number of turns of the inductance element L2 and further adjusting the resonance frequency. In this case, when the width of the conductor that forms the inductance element L3 is equal to the width of the conductor that forms the inductance element L2, the characteristic impedance of the inductance element L2 is the same as that of the inductance element L3. This permits an oscillation with an excellent C/N ratio to be obtained.

Figure 10:
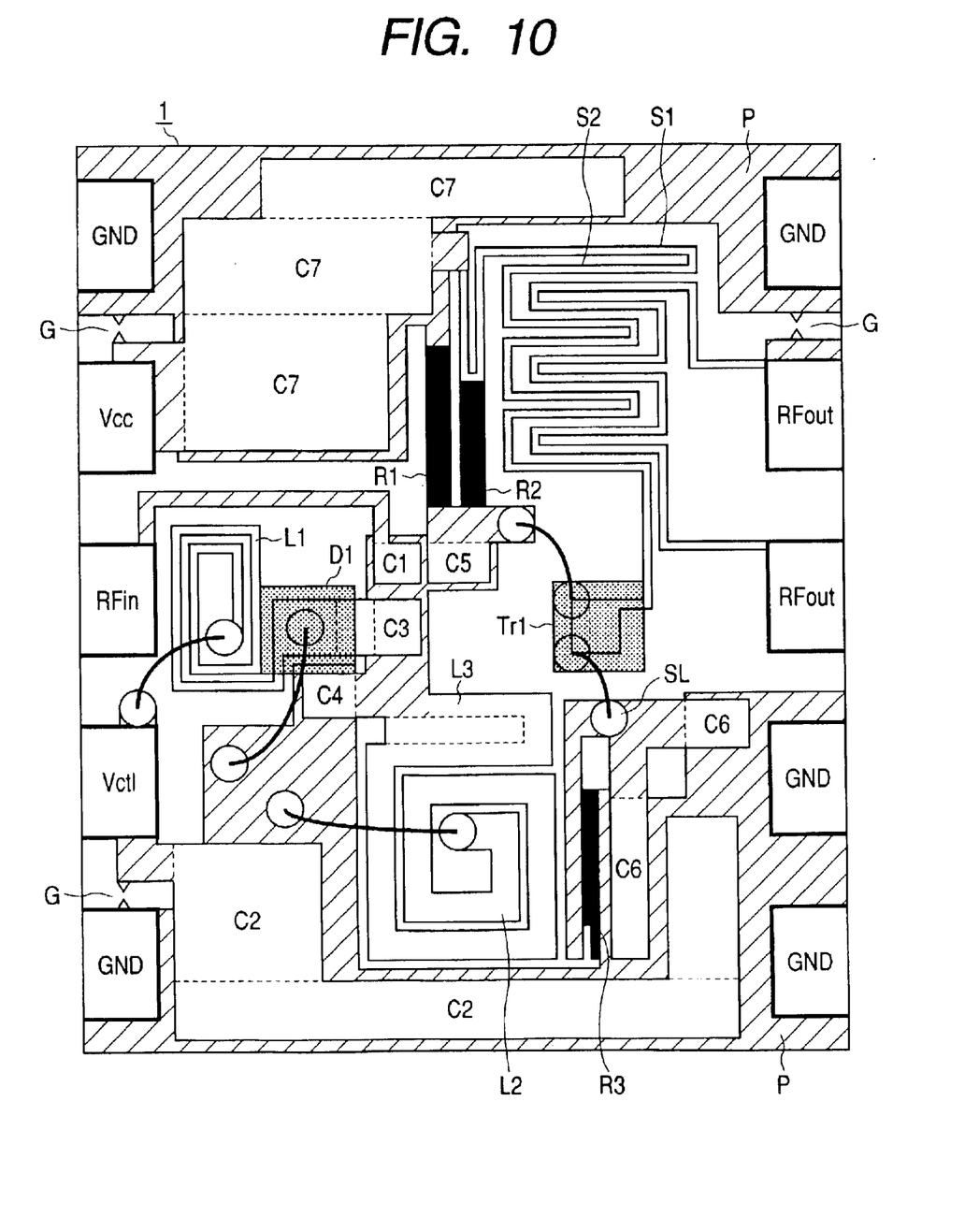

As described above, the unbalance/balance conversion element T contains inductance elements that comprise a pair of thin film conductive paths S1 and S2 coupled with each other. The conductive paths S1 and S2 are formed in spiral shapes that oppose each other and have a predetermined gap between them on the alumina substrate 1. One end of one conductive path S1 is connected to the collector electrode of the transistor Tr1 and the other end is connected to the upper conductive patterns P connected to the capacitor C7. Both ends of the other conductive path S2 are connected to a pair of RFout electrodes. In this case, since the conductive paths S1 and S2 are thin films, they may be formed precisely and with accurate dimensions. This permits the gap between both conductive paths S1 and S2 to be narrowed to ensure a desired degree of coupling and thus a small unbalance/balance conversion element T to be provided in a limited space on the alumina substrate 1. As shown in FIG. 10, in another embodiment the opposing conductive paths S1 and S2 are formed in a zigzag pattern on the alumina substrate 1.

The diode D1 and transistor Tr1 comprise semiconductor chips, which are mounted on connection lands in the upper conductive patterns P and wire bonded to the upper conductive patterns P. That is, as shown in FIG. 2, the semiconductor chip of the diode D1 has a square shape, one electrode is provided on an undersurface of the chip and is fixed on the connection land using a creamy solder or conductive adhesive such as a conductive paste, and the other electrode is provided on a top surface of the semiconductor chip and is bonded to a predetermined region in the upper conductive pattern P by wire bonding.

The semiconductor chip of the transistor Tr1 also has a square shape. The collector electrode of the transistor Tr1 is provided on an undersurface of the chip and is fixed on the connection land using the conductive adhesive. The base and emitter electrodes are bonded to predetermined regions in the upper conductive patterns P by wire bonding.

Figure 7A:
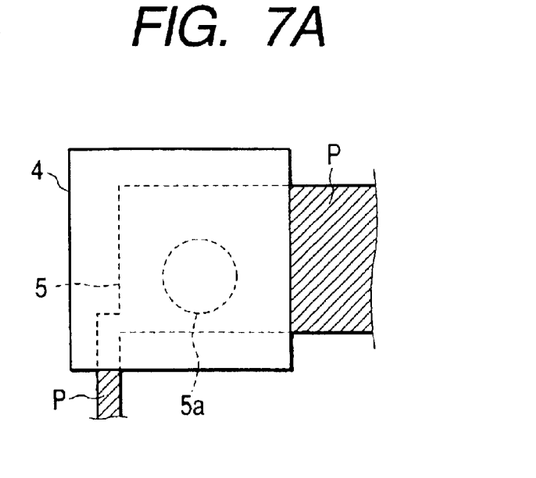
FIG. 7 is an explanation view showing a relation between a semiconductor chip and connection land.
Figure 7B:
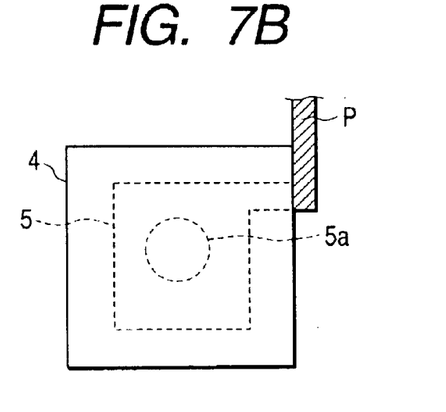

Like the edge electrodes 3 described above, a Ni foundation plating layer and Au plating layer are stacked successively on the connection lands. Here, as shown in FIG. 7A or FIG. 7B, the area of the connection land 5 is small compared with the area of the lower surface of the semiconductor chip 4. This configuration ensures adequate space for a pool of the conductive adhesive formed below the semiconductor chip 4 during attachment, which in turn prevents accidental extrusion of the conductive adhesive from the dimensions corresponding to the semiconductor chip 4 and thus shorting to the surrounding upper conductive patterns P. In addition, an opening 5a is provided within the connection land 5, which further prevents extrusion of the conductive adhesive as excessive conductive adhesive is pooled in the opening 5a.

Next, a fabrication process of the electronic circuit unit configured as above is described with respect to FIG. 8.

Figure 8A:
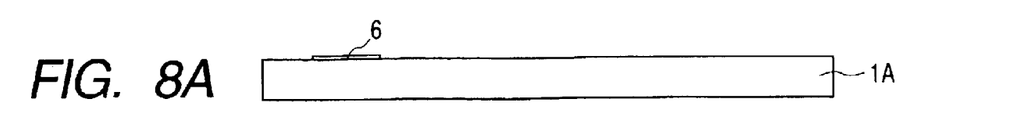
FIG. 8 is an explanation view showing a fabrication process of the electronic circuit unit.
Figure 8B:
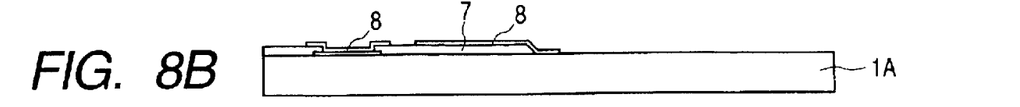

First, dividing grooves extending lengthwise and crosswise in a grid pattern are engraved on a relatively large substrate 1A that contains an alumina material. As shown in FIG. 8A, $TaSiO_2$ is sputtered on an entire surface of the large substrate 1A, etched into a desired pattern to form a resistance film 6, thereby forming areas corresponding to the resistors R1 to R3. After the areas are formed, as shown in FIG. 8B, Cr and Cu are sputtered on the resistance film 6 and etched into a desired pattern to form a lower electrode 7. $SiO_2$ is then sputtered on the lower electrode 7 and etched into a desired pattern to form a dielectric film 8.

Figure 8C:
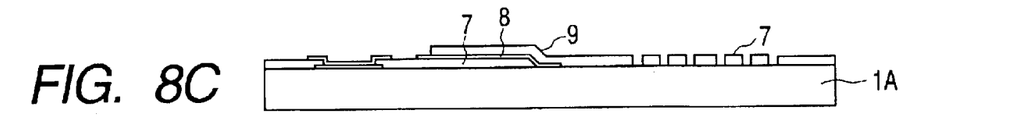

Next, as shown in FIG. 8C, Cr and Cu are sputtered on the dielectric film 8 and etched into a desired pattern to form an upper electrode 9. As a result, the lower electrode 7 and upper electrode 9 form areas corresponding to the upper conductive patterns P, inductance elements L1 to L3, and conductive paths S1 and S2, and a stack of the lower electrode 7, dielectric film 8, and upper electrode 9 forms areas corresponding to the capacitors C1 to C7.

Figure 8D:
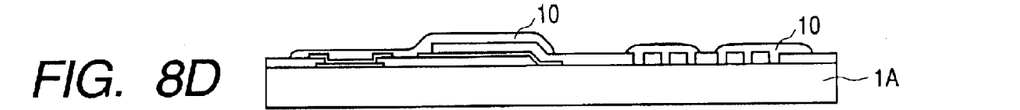
Figure 8E:
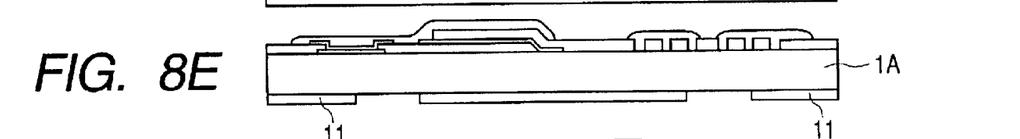

A Cu layer is subsequently formed on surfaces of the areas corresponding to the inductance elements L1 to L3, conductive paths S1 and S2, and capacitors C1 to C7 by plating or other thin film techniques, then, as shown in FIG. 8D, a protective film 10 is formed on areas other than the upper conductive patterns P. As shown in FIG. 8E, Cr and Cu are sputtered on an entire back surface of the large substrate 1A and etched in a desired pattern to form a back surface electrode 11, thereby forming areas corresponding to the lower conductive patterns P1 on the back surface.

Figure 8F:
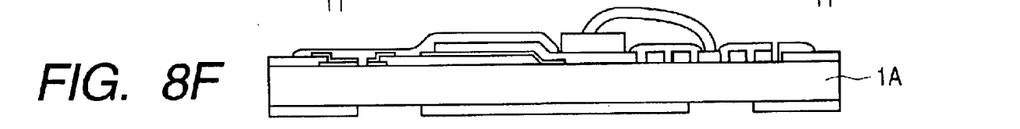

Next, the Ni foundation layer and Au layer are plated successively on respective surfaces of the upper conductive patterns P and lower conductive patterns P1. As shown in FIG. 8F, the semiconductor chips of the diode D1 and transistor Tr1 are then fixed on respective connection lands in the upper conductive patterns P using the creamy solder or conductive adhesive such as the conductive paste. The semiconductor chips are bonded to the predetermined regions in the upper conductive patterns P by wire bonding. The emitter resistor R3 is subsequently trimmed to adjust the output and the inductance element L3 is trimmed to adjust the resonance frequency.

Figure 8G:
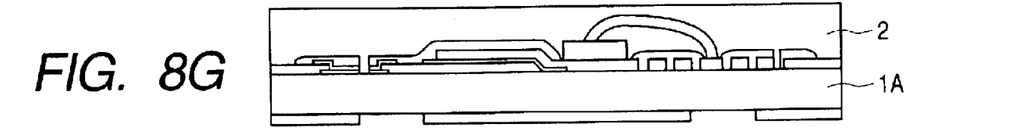

After the semiconductor chips are mounted and adjustments have been made, the epoxy-based thermosetting resin is potted on the entire surface of the substrate 1A and cured. The sealing resin 2 thus seals all the elements forming the circuit on the large substrate 1A including respective semiconductor chips, as shown in FIG. 8G.

Figure 8H:
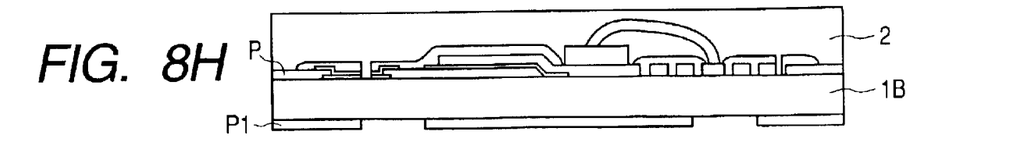

The processes from FIG. 8A to FIG. 8G described above are performed with respect to the substrate 1A, while processes from FIG. 8H to FIG. 8J described below are performed with respect to the stripe substrate 1B obtained by cutting the large substrate 1A along a unidirectional dividing groove.

That is, first, the large substrate 1A is cut along the unidirectional dividing groove by dicing, thereby obtaining multiple stripe substrates 1B. FIG. 8H shows one of the stripe substrates 1B, and, as shown in the drawing, the sealing resin 2 is also cut by the dicing of the large substrate 1A. Because of the dicing, the edges of the upper conductive patterns P are exposed from cut surfaces (side surfaces) of the sealing resin 2. At that time, when the large substrate 1A is diced in a direction from the lower conductive patterns P1 to the sealing resin 2 (from bottom to top in the drawing), since a shear force presses the back surface of the large substrate 1A, the edges of the lower conductive patterns P1 are not peeled from the back surface of the large substrate 1A. Although the shear force tends to cause peeling of the upper conductive patterns P from the upper surface of the large substrate 1A, since the sealing resin 2 is potted on the entire surface of the large substrate 1A, the sealing resin 2 blocks the peeling of the edges of the upper conductive patterns P. Peeling of both the upper conductive patterns P and lower conductive pattern P1 is thus prevented.

Figure 8I:
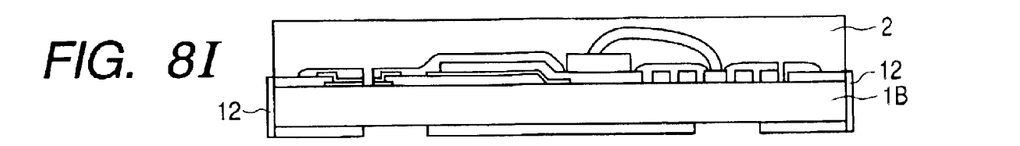

Next, as shown in FIG. 8I, Cr and Cu are sputtered on both side surfaces, which are the cut surfaces, of the stripe substrate 1B to form a thin-film conductive layer 12. The ground electrodes (GND) for the upper conductive patterns P exposed from the sealing resin 2, input electrodes (Vcc, Vctl, RFin) and output electrodes (RFout) are connected electrically to the edges of the lower conductive patterns P opposed to the electrodes through the thin-film conductive layer 12.

Figure 8J:
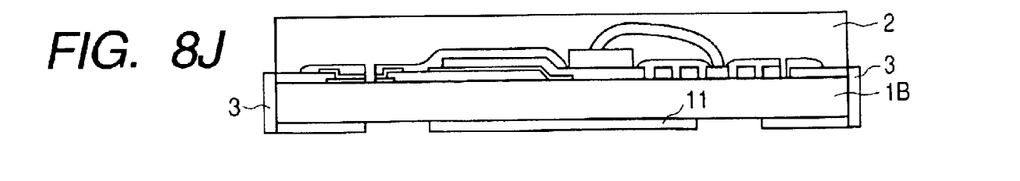

The Ni foundation layer and Au layer are then plated successively on a surface of the thin-film conductive layer 12, and, as shown in FIG. 8J, areas corresponding to the edge electrodes 3 are formed on both side-surfaces of the stripe substrate 1B.

Although the process used to form the thin film for the thin-film conductive layer 12 and the plating process in which the Ni foundation layer and Au layer are plated may be performed with respect to a single stripe substrate 1B, both of these processes may be performed simultaneously. More specifically, the multiple stripe substrates 1B may be aligned in an orderly fashion on an adhesive material, such as tape, and attached to the tape. The thin-film conductive layer 12 may then be simultaneously sputtered and subsequently the Ni foundation layer and Au layer may then be plated simultaneously on the multiple stripe substrates 1B. This allows the processes to be suitable for mass production.

The stripe substrate 1B is next divided into the individual alumina substrates 1 along the other dividing groove. The result is the electronic circuit unit shown in FIG. 1. For the electronic circuit unit fabricated in this manner, the metal shield cover may be attached on the sealing resin 2 as required.

According to the electronic circuit unit according to the embodiments, the thin film circuit elements including the capacitors C1 to C7, resistors R1 to R3, inductance elements L1 to L3, and conductive paths S1 and S2, and the upper conductive patterns P connected to the circuit elements are formed on the alumina substrate 1. The semiconductor chips of the diode D1 and transistor Tr1 are bonded to the alumina substrate 1 by wire bonding, and the thin-film circuit elements and semiconductor chips are sealed on the alumina substrate 1 by potting the sealing resin 2. This results in a surface-mounting type electronic circuit unit that is miniaturized to a larger extent than conventional surface-mounting type electronic circuit units.

In addition, in the thin film upper conductive patterns P and lower conductive patterns P1 formed on both top and back surfaces of the alumina substrate 1 respectively, the edges of the ground electrodes (GND) forming part of the upper conductive patterns P, input electrodes (Vcc, Vctl, RFin), and output electrodes (RFout) are exposed from the side surfaces of the sealing resin 2. The thin-film conductive layers 12 (edge electrodes 3) sputtered on the side surfaces of the alumina substrate 1 provide a connection between respective edges of the ground electrodes (GND), input electrodes (Vcc, Vctl, RFin), and output electrodes (RFout), and edges of the lower conductive patterns P1 opposed to the electrodes. This permits the fabrication process of the edge electrodes 3 to be simplified.

Further, regarding the fabrication process of the edge electrodes 3, after the formation of the thin film circuit elements, wire bonding of the semiconductor chips and potting of the sealing resin 2 are performed on the large substrate 1A. Later, the edge electrode fabrication process can be simultaneously performed with respect to the multiple stripe substrates 1B obtained by dicing of the large substrate 1A, therefore the productivity in mass production can be improved. Moreover, when the large substrate 1A is divided into the multiple stripe substrates 1B by dicing, the dicing is performed in a direction from the lower conductive patterns P1 to the upper conductive patterns P. Although the shear force acts on the upper conductive patterns P and in general causes peeling from the substrate, the peeling can be resisted by the sealing resin 2. Thus, the peeling of the upper conductive patterns P and lower conductive patterns P1 is prevented during dicing.

The invention is implemented in the modes as described above, and has advantages described below.

The thin film circuit elements including the capacitors, resistors, and inductance elements are formed precisely, and the semiconductor elements comprise chips to which wire bonding is performed. This permits the circuit components to be mounted precisely on the alumina substrate and moreover, since the circuit components are sealed by the thermosetting resin, produces a surface-mounting type of electronic circuit unit that may be miniaturized to a greater extent than conventional surface-mounting type of electronic circuit units. In addition, in the thin film upper conductive patterns and lower conductive patterns that are formed on both surfaces of the alumina substrate, the edges of the upper conductive patterns are exposed from the side surfaces of the thermosetting resin and the edge electrodes sputtered on the side surfaces of the alumina substrate provide a connection between respective edges of the upper conductive patterns and lower conductive patterns. This permits the process for forming the edge electrodes to be simplified.

What is claimed is:

1. An electronic circuit unit comprising:

an alumina substrate;

thin film circuit elements including at least one capacitor, at least one resistor, and at least one inductance element formed on one surface of the alumina substrate;

an upper conductive pattern and lower conductive pattern formed on the one surface and an opposing surface of the alumina substrate, respectively, the upper and lower conductive patterns being thin films;

at least one semiconductor chip wire bonded to the upper conductive pattern;

a thermosetting resin that seals the circuit elements, upper conductive pattern, and semiconductor chip on the alumina substrate; and an edge electrode sputtered on a side surface of the alumina substrate, wherein an edge of the upper conductive pattern is exposed from a side surface of the thermosetting resin, and the edge electrode provides a connection between respective edges of the upper conductive pattern and the lower conductive pattern, and ground electrodes are disposed near corners on a first side of the one surface and on a second side opposing the first side with non-ground electrodes disposed between the ground electrodes, and on the second side a ground electrode is disposed adjacent to one of the other two ground electrodes.

2. The electronic circuit unit according to claim 1, wherein a lower nickel plating layer and an upper gold plating layer are provided on the edge electrode, the nickel layer thick enough to provide adhesion of the gold layer to the edge electrode and the gold layer thick enough to reduce contact resistance of the edge electrode.

3. The electronic circuit unit according to claim 1, wherein a pair of projections narrows a gap portion between at least one of the capacitors and at least one of the non-ground electrodes.

4. The electronic circuit unit according to claim 1, wherein the thin film circuit elements include at least first and second capacitors, the first capacitor has a concave shape with two rectangles projecting from one side of another rectangle, and the second capacitor has a tri-rectangular shape with three rectangles arranged continuously in a dislocated relation along a long side of the tri-rectangular shape.

5. The electronic circuit unit according to claim 1, wherein the thin film circuit elements include at least a pair of resistors and another resistor, the pair of resistors forming a voltage divider and disposed parallel and adjacent to each other, the other resistor separated by relatively large distance compared with a distance separating the pair of resistors, ratios of resistances of the pair of resistors from desired values being equal.

6. The electronic circuit unit according to claim 1, wherein the thin film circuit elements include a conductive path connected with an end of one of the inductance elements, the conductive path to increase an inductance of the one of the inductance elements and having a width and characteristic impedance equal to that of the one of the inductance elements.

7. The electronic circuit unit according to claim 1, wherein the semiconductor chip is fixed on a connection land using conductive adhesive, the connection land having an area smaller than that of a lower surface of the semiconductor chip, the area of the conduction land small enough such that extrusion of the conductive adhesive from dimensions corresponding to semiconductor chip and shorting to the surrounding upper conductive pattern is prevented.

8. The electronic circuit unit according to claim 7, wherein an opening is provided within the connection land in which the conductive adhesive pools.

9. The electronic circuit unit according to claim 1, wherein the substrate is defined by dividing grooves of a larger substrate, the grooves extending lengthwise and crosswise and forming the side surfaces of the substrate.

10. The electronic circuit unit according to claim 1, the semiconductor chip is fixed on a connection land using conductive adhesive, the connection land having an area smaller than that of a lower surface of the semiconductor chip, the area of the conduction land small enough such that extrusion of the conductive adhesive from dimensions corresponding to semiconductor chip and shorting to the surrounding upper conductive pattern is prevented.

11. The electronic circuit unit according to claim 10, wherein an opening is provided within the connection land in which the conductive adhesive pools.

12. An electronic circuit unit comprising:
an alumina substrate;
thin film circuit elements including at least one capacitor, at least one resistor, and at least one inductance element formed on one surface of the alumina substrate;
an upper conductive pattern and lower conductive pattern formed on the one surface and an opposing surface of the alumina substrate, respectively, the upper and lower conductive patterns being thin films;
at least one semiconductor chip wire bonded to the upper conductive pattern;
a thermosetting resin that seals the circuit elements, upper conductive pattern, and semiconductor chip on the alumina substrate; and
an edge electrode sputtered on a side surface of the alumina substrate,
wherein an edge of the upper conductive pattern is exposed from a side surface of the thermosetting resin, and the edge electrode provides a connection between respective edges of the upper conductive pattern and the lower conductive pattern, and
the thin film circuit elements include at least first and second capacitors, the first capacitor has a concave shape with two rectangles projecting from one side of another rectangle, and the second capacitor has a tri-rectangular shape with three rectangles arranged continuously in a dislocated relation along a long side of the tri-rectangular shape.

13. The electronic circuit unit according to claim 12, wherein a lower nickel plating layer and an upper gold plating layer are provided on the edge electrode, the nickel layer thick enough to provide adhesion of the gold layer to the edge electrode and the gold layer thick enough to reduce contact resistance of the edge electrode.

14. The electronic circuit unit according to claim 12, wherein a pair of projections narrows a gap portion between at least one of the capacitors and at least one of the non-ground electrodes.

15. The electronic circuit unit according to claim 12, wherein the thin film circuit elements include at least a pair of resistors and another resistor, the pair of resistors forming a voltage divider and disposed parallel and adjacent to each other, the other resistor separated by relatively large distance compared with a distance separating the pair of resistors, ratios of resistances of the pair of resistors from desired values being equal.

16. The electronic circuit unit according to claim 12, wherein the thin film circuit elements include a conductive path connected with an end of one of the inductance elements, the conductive path to increase an inductance of the one of the inductance elements and having a width and characteristic impedance equal to that of the one of the inductance elements.

17. The electronic circuit unit according to claim 12, wherein the semiconductor chip is fixed on a connection land using conductive adhesive, the connection land having an area smaller than that of a lower surface of the semiconductor chip, the area of the conduction land small enough such that extrusion of the conductive adhesive from dimensions corresponding to semiconductor chip and shorting to the surrounding upper conductive pattern is prevented.

18. The electronic circuit unit according to claim 17, wherein an opening is provided within the connection land in which the conductive adhesive pools.

19. The electronic circuit unit according to claim 12, wherein the substrate is defined by dividing grooves of a larger substrate, the grooves extending lengthwise and crosswise and forming the side surfaces of the substrate.

20. An electronic circuit unit comprising:
an alumina substrate;
thin film circuit elements including at least one capacitor, at least one resistor, and at least one inductance element formed on one surface of the alumina substrate;

an upper conductive pattern and lower conductive pattern formed on the one surface and an opposing surface of the alumina substrate, respectively, the upper and lower conductive patterns being thin films;

at least one semiconductor chip wire bonded to the upper conductive pattern;

a thermosetting resin that seals the circuit elements, upper conductive pattern, and semiconductor chip on the alumina substrate; and an edge electrode sputtered on a side surface of the alumina substrate, wherein an edge of the upper conductive pattern is exposed from a side surface of the thermosetting resin, and the edge electrode provides a connection between respective edges of the upper conductive pattern and the lower conductive pattern, and the thin film circuit elements include at least a pair of resistors and another resistor, the pair of resistors forming a voltage divider and disposed parallel and adjacent to each other, the other resistor separated by relatively large distance compared with a distance separating the pair of resistors, ratios of resistances of the pair of resistors from desired values being equal.

21. The electronic circuit unit according to claim 20, wherein a lower nickel plating layer and an upper gold plating layer are provided on the edge electrode, the nickel layer thick enough to provide adhesion of the gold layer to the edge electrode and the gold layer thick enough to reduce contact resistance of the edge electrode.

22. The electronic circuit unit according to claim 20, wherein ground electrodes are disposed near corners on a first side of the one surface and on a second side opposing the first side with non-ground electrodes disposed between the ground electrodes, and on the second side a ground electrode is disposed adjacent to one of the other two ground electrodes and a pair of projections narrows a gap portion between at least one of the capacitors and at least one of the non-ground electrodes.

23. The electronic circuit unit according to claim 20, wherein the thin film circuit elements include a conductive path connected with an end of one of the inductance elements, the conductive path to increase an inductance of the one of the inductance elements and having a width and characteristic impedance equal to that of the one of the inductance elements.

24. The electronic circuit unit according to claim 20, wherein the semiconductor chip is fixed on a connection land using conductive adhesive, the connection land having an area smaller than that of a lower surface of the semiconductor chip, the area of the conduction land small enough such that extrusion of the conductive adhesive from dimensions corresponding to semiconductor chip and shorting to the surrounding upper conductive pattern is prevented.

25. The electronic circuit unit according to claim 24, wherein an opening is provided within the connection land in which the conductive adhesive pools.

26. The electronic circuit unit according to claim 20, wherein the substrate is defined by dividing grooves of a larger substrate, the grooves extending lengthwise and crosswise and forming the side surfaces of the substrate.

27. An electronic circuit unit comprising:

an alumina substrate;

thin film circuit elements including at least one capacitor, at least one resistor, and at least one inductance element formed on one surface of the alumina substrate;

an upper conductive pattern and lower conductive pattern formed on the one surface and an opposing surface of the alumina substrate, respectively, the upper and lower conductive patterns being thin films;

at least one semiconductor chip wire bonded to the upper conductive pattern;

a thermosetting resin that seals the circuit elements, upper conductive pattern, and semiconductor chip on the alumina substrate; and an edge electrode sputtered on a side surface of the alumina substrate, wherein an edge of the upper conductive pattern is exposed from a side surface of the thermosetting resin, and the edge electrode provides a connection between respective edges of the upper conductive pattern and the lower conductive pattern, and the thin film circuit elements include a conductive path connected with an end of one of the inductance elements, the conductive path to increase an inductance of the one of the inductance elements and having a width and characteristic impedance equal to that of the one of the inductance elements.

28. The electronic circuit unit according to claim 27, wherein a lower nickel plating layer and an upper gold plating layer are provided on the edge electrode, the nickel layer thick enough to provide adhesion of the gold layer to the edge electrode and the gold layer thick enough to reduce contact resistance of the edge electrode.

29. The electronic circuit unit according to claim 27, wherein ground electrodes are disposed near corners on a first side of the one surface and on a second side opposing the first side with non-ground electrodes disposed between the ground electrodes, and on the second side a ground electrode is disposed adjacent to one of the other two ground electrodes and a pair of projections narrows a gap portion between at least one of the capacitors and at least one of the non-ground electrodes.

30. The electronic circuit unit according to claim 27, wherein the substrate is defined by dividing grooves of a larger substrate, the grooves extending lengthwise and crosswise and forming the side surfaces of the substrate.

31. An electronic circuit unit comprising:

an alumina substrate;

thin film circuit elements including at least one capacitor, at least one resistor, and at least one inductance element formed on one surface of the alumina substrate;

an upper conductive pattern and lower conductive pattern formed on the one surface and an opposing surface of the alumina substrate, respectively, the upper and lower conductive patterns being thin films;

at least one semiconductor chip wire bonded to the upper conductive pattern;

a thermosetting resin that seals the circuit elements, upper conductive pattern, and semiconductor chip on the alumina substrate; and an edge electrode sputtered on a side surface of the alumina substrate, wherein an edge of the upper conductive pattern is exposed from a side surface of the thermosetting resin, and the edge electrode provides a connection between respective edges of the upper conductive pattern and the lower conductive pattern, and the semiconductor chip is fixed on a connection land using conductive adhesive, the connection land having an area smaller than that of a lower surface of the semiconductor chip, the area of the conduction land small enough such that extrusion of the conductive adhesive from dimensions corresponding to semiconductor chip and shorting to the surrounding upper conductive pattern is prevented.

32. The electronic circuit unit according to claim 31, wherein a lower nickel plating layer and an upper gold plating layer are provided on the edge electrode, the nickel layer thick enough to provide adhesion of the gold layer to the edge electrode and the gold layer thick enough to reduce contact resistance of the edge electrode.

33. The electronic circuit unit according to claim 31, wherein ground electrodes are disposed near corners on a first side of the one surface and on a second side opposing the first side with non-ground electrodes disposed between the ground electrodes, and on the second side a ground electrode is disposed adjacent to one of the other two ground electrodes and a pair of projections narrows a gap portion between at least one of the capacitors and at least one of the non-ground electrodes.

34. The electronic circuit unit according to claim 31, wherein an opening is provided within the connection land in which the conductive adhesive pools.

35. The electronic circuit unit according to claim 31, wherein the substrate is defined by dividing grooves of a larger substrate, the grooves extending lengthwise and crosswise and forming the side surfaces of the substrate.

36. An electronic circuit unit comprising:
an alumina substrate;
thin film circuit elements including at least one capacitor, at least one resistor, and at least one inductance element formed on one surface of the alumina substrate;
an upper conductive pattern and lower conductive pattern formed on the one surface and an opposing surface of the alumina substrate, respectively, the upper and lower conductive patterns being thin films;
at least one semiconductor chip wire bonded to the upper conductive pattern;
thermosetting resin that seals the circuit elements, upper conductive pattern, and semiconductor chip on the alumina substrate; and
an edge electrode sputtered on a side surface of the alumina substrate,
wherein an edge of the upper conductive pattern is exposed from a side surface of the thermosetting resin, and the edge electrode provides a connection between respective edges of the upper conductive pattern and the lower conductive pattern, and
the substrate is defined by dividing grooves or a larger substrate, the grooves extending lengthwise and crosswise and forming the side surfaces of the substrate.

37. The electronic circuit unit according to claim 36, wherein a lower nickel plating layer and an upper gold plating layer are provided on the edge electrode, the nickel layer thick enough to provide adhesion of the gold layer to the edge electrode and the gold layer thick enough to reduce contact resistance of the edge electrode.

38. The electronic circuit unit according to claim 36, wherein ground electrodes are disposed near corners on a first side of the one surface and on a second side opposing the first side with non-ground electrodes disposed between the ground electrodes, and on the second side a ground electrode is disposed adjacent to one of the other two ground electrodes and a pair of projections narrows a gap portion between at least one of the capacitors and at least one of the non-ground electrodes.

39. The electronic circuit unit according to claim 36, wherein the semiconductor chip is fixed on a connection land using conductive adhesive, the connection land having an area smaller than that of a lower surface of the semiconductor chip, the area of the conduction land small enough such that extrusion of the conductive adhesive from dimensions corresponding to semiconductor chip and shorting to the surrounding upper conductive pattern is prevented and an opening is provided within the connection land in which the conductive adhesive pools.

* * * * *